US010044959B2

(12) United States Patent
Galor Gluskin

(10) Patent No.: US 10,044,959 B2
(45) Date of Patent: Aug. 7, 2018

(54) MASK-LESS PHASE DETECTION AUTOFOCUS

(71) Applicant: QUALCOMM Incorporated, San Diego, CA (US)

(72) Inventor: Micha Galor Gluskin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 244 days.

(21) Appl. No.: 14/864,153

(22) Filed: Sep. 24, 2015

(65) Prior Publication Data
US 2017/0094210 A1 Mar. 30, 2017

(51) Int. Cl.
*H04N 5/369* (2011.01)
*H04N 5/232* (2006.01)
(Continued)

(52) U.S. Cl.
CPC .............. *H04N 5/3696* (2013.01); *G02B 7/09* (2013.01); *H01L 27/14621* (2013.01);
(Continued)

(58) Field of Classification Search
CPC ... H04N 5/3696; G02B 7/09; H01L 27/14621
See application file for complete search history.

(56) References Cited

U.S. PATENT DOCUMENTS 7,808,023 B2 * 10/2010 Yang ................. H01L 27/14621
257/291
9,117,718 B2 * 8/2015 Ohshitanai ........ H01L 27/14625
(Continued)

FOREIGN PATENT DOCUMENTS

JP  2007103590 A  4/2007
JP  2012168246 A  9/2012

OTHER PUBLICATIONS

Davies C, "Canon EOS 70D Dual Pixel CMOS AF "revolutionary" system detailed", Slash Gear, Jul. 2, 2013, Retrieved from internet, URL: http://www.slashgear.com/canon-eos-70d-dual-pixel-cmos-af-revolutionary-system-detailed-02288750/ , 5 Pages.
(Continued)

*Primary Examiner* — Cynthia Segura
(74) *Attorney, Agent, or Firm* — Knobbe, Martens, Olson & Bear, LLP

(57) ABSTRACT

An example image capture device includes an image sensor having diodes for sensing light from a target scene, a color filter array disposed above the diodes and including color filters each positioned over one of the diodes, single-diode microlenses positioned above some color filters arranged in a Bayer pattern, and multi-diode microlenses each positioned above at least two adjacent color filters that pass the same wavelengths of light to corresponding adjacent diodes below the color filters, each multi-diode microlens formed such that light incident in a first direction is collected one of the adjacent diodes and light incident in a second direction is collected in another of adjacent diodes. An image signal processor of the image capture device can perform phase detection autofocus using signals received from the adjacent diodes and can interpolate color values for the adjacent diodes.

22 Claims, 9 Drawing Sheets

(51) Int. Cl.
*G02B 7/09* (2006.01)
*H01L 27/146* (2006.01)
*H04N 9/04* (2006.01)

(52) U.S. Cl.
CPC ... *H01L 27/14627* (2013.01); *H04N 5/23212* (2013.01); *H04N 9/045* (2013.01)

(56) References Cited

U.S. PATENT DOCUMENTS

| | | | | |
|---|---|---|---|---|
| 9,172,927 | B2* | 10/2015 | Aoki | G03B 13/36 |
| 9,231,005 | B2* | 1/2016 | Meynants | H01L 27/14605 |
| 9,344,620 | B2* | 5/2016 | Izawa | G02B 7/34 |
| 9,420,164 | B1* | 8/2016 | Galor Gluskin | H04N 5/23212 |
| 9,711,553 | B2* | 7/2017 | Kim | H01L 27/1463 |
| 9,804,357 | B2* | 10/2017 | Galor Gluskin | G02B 7/285 |
| 9,807,294 | B2* | 10/2017 | Liu | H04N 5/23212 |
| 2010/0238330 | A1* | 9/2010 | Hirota | H01L 27/14621 348/273 |
| 2012/0033120 | A1* | 2/2012 | Nakamura | H04N 5/23212 348/302 |
| 2012/0194696 | A1* | 8/2012 | Ohshitanai | H01L 27/14625 348/222.1 |
| 2012/0326011 | A1* | 12/2012 | Ichimura | H01L 31/02327 250/208.1 |
| 2013/0076968 | A1* | 3/2013 | Ueda | H04N 5/343 348/345 |
| 2013/0127002 | A1 | 5/2013 | Okigawa | |
| 2013/0222546 | A1 | 8/2013 | Takahashi | |
| 2013/0222553 | A1* | 8/2013 | Tsuchita | H01L 27/14627 348/49 |
| 2013/0335533 | A1* | 12/2013 | Yamazaki | H04N 13/0225 348/49 |
| 2014/0146218 | A1* | 5/2014 | Kunieda | H04N 5/23212 348/345 |
| 2015/0062390 | A1 | 3/2015 | Kim et al. | |
| 2015/0062391 | A1* | 3/2015 | Murata | H01L 27/14603 348/280 |
| 2015/0146052 | A1* | 5/2015 | Sawadaishi | G02B 7/34 348/266 |
| 2016/0094776 | A1* | 3/2016 | Takahashi | H04N 5/23212 348/349 |
| 2016/0195429 | A1* | 7/2016 | Boettiger | G01J 1/0411 250/208.2 |
| 2017/0090149 | A1* | 3/2017 | Galor Gluskin | G02B 7/285 |
| 2017/0332003 | A1* | 11/2017 | Hamano | H04N 5/23212 |
| 2018/0131862 | A1* | 5/2018 | Galor Gluskin | G06T 7/11 |
| 2018/0139378 | A1* | 5/2018 | Moriuchi | H04N 5/23212 |

OTHER PUBLICATIONS

Sliwinski P., et al., "A Simple Model for On-Sensor Phase-Detection Autofocusing Algorithm", Journal of Computer and Communications, 2013, vol. 1, pp. 11-17.
International Search Report and Written Opinion—PCT/US2016/048156—ISA/EPO—dated Dec. 19, 2016.

* cited by examiner

MASK-LESS PHASE DETECTION AUTOFOCUS

TECHNICAL FIELD

The systems and methods disclosed herein are directed to phase detection autofocus, and, more particularly, to mask-less phase detection autofocus sensors and processing techniques.

BACKGROUND

Some image capture devices use phase difference detection sensors (which may also be referred to as "pixels") to perform autofocus. On-sensor phase difference detection works by interspersing phase difference detection pixels between imaging pixels, typically arranged in repeating sparse patterns of left and right pixels. The system detects phase differences between signals generated by different phase difference detection pixels, for example between a left pixel and a nearby right pixel. The detected phase differences can be used to perform autofocus.

Phase detection autofocus operates faster than contrast-based autofocus, however current implementations place a metal mask over the image sensor to create left and right phase detection pixels, resulting in less light reaching the masked pixels. Typical imaging sensors have a microlens formed over each individual pixel to focus light onto each pixel, and the phase detection autofocus mask placed over the microlenses reduces the light entering the microlens of a phase detection pixel by about 50%. Because the output of phase detection pixels has lower brightness than the output of normal image capturing pixels, the phase difference detection pixels create noticeable artifacts in captured images that require correction. By placing the phase detection pixels individually amidst imaging pixels, the system can interpolate values for the phase detection pixels.

Masked pixels are used in pairs. When the scene is out of focus, the phase detection pixel mask phase shifts the incoming light slightly. The distance between phase detection pixels, combined with their relative shifts, can be convolved to give a determination of how far an optical assembly of an imaging device needs to move a lens to bring the scene into focus.

SUMMARY

In general, this disclosure is related to mask-less phase detection pixels by using microlenses formed to extend over adjacent pixels, or sensing elements (for example, photodiodes) in an image sensor to provide phase difference information. According to the designs described herein, color filters placed between a multi-pixel microlens and the corresponding diodes can be selected to pass the same wavelengths of light. In one embodiment, color filters disposed between the multi-pixel microlens and the corresponding diodes can be selected to pass green light. However, color filters placed between single-pixel microlenses and corresponding diodes can follow the standard Bayer pattern.

One innovation includes an image capture device comprising an image sensor including a plurality of diodes for sensing light from a target scene; a color filter array disposed above the plurality of diodes, the color filter array including a plurality of color filters each positioned over one of the plurality of diodes; a plurality of single-diode microlenses each positioned above one of the plurality of color filters, the plurality of color filters corresponding to the plurality of single-diode microlenses arranged in a Bayer pattern; a plurality of multi-diode microlenses for phase difference detection, each multi-diode microlens of the plurality of multi-diode microlenses positioned above at least two adjacent color filters of the plurality of color filters, each of the at least two adjacent color filters configured to pass the same wavelengths of light, and formed such that light incident in a first direction is collected in a first diode of the at least two adjacent diodes and light incident in a second direction is collected in a second diode of the at least two adjacent diodes; and an image signal processor configured to perform phase detection autofocus using values received from the at least two adjacent diodes.

The following are non-limiting examples of some features and embodiments of such image capture devices. For example, for each of the plurality of multi-diode microlenses, wavelengths of light that the at least two adjacent color filters are configured to pass can correspond to green light. Each of the plurality of multi-diode microlenses can be positioned over two adjacent color filters and associated diodes, or over a 2×2 cluster of color filters and associated diodes. In some examples, to perform phase detection autofocus, the image signal processor can be further configured to receive, from the first diode, first image data representing light incident on the image sensor in the first direction; receive, from the second diode, second image data representing light incident on the image sensor in the second direction; calculate disparity between the first image data and the second image data; and use the disparity to generate focus instructions. The image capture device can further include a movable lens assembly positioned above the image sensor, and the focus instructions can include a distance and direction for moving the movable lens assembly to a desired focus position. The image signal processor can be further configured to generate instructions that cause the image sensor to capture image data with the movable lens assembly positioned in the desired focus position and, based at least partly on the image data, construct a final image of the target scene. The image capture device can further include a lens assembly positioned above the image sensor, wherein the image sensor is movable relative to the lens assembly, and the focus instructions can include a distance and direction for moving the image sensor to a desired focus position. The plurality of single-diode microlenses and the plurality of multi-diode microlenses can be arranged in a repeating pattern having the plurality of multi-diode microlenses each located one of a plurality of autofocus points in the repeating pattern.

Another innovation includes an image sensor including a plurality of diodes for sensing light from a target scene; a color filter array disposed above the plurality of diodes, the color filter array including a plurality of color filters each positioned over one of the plurality of diodes; and a plurality of microlenses disposed above the color filter array, the plurality of microlenses including a first subset including a plurality of single-diode microlenses each positioned above one of the plurality of color filters, the color filters of the plurality of color filters corresponding to the plurality of single-diode microlenses arranged in a Bayer pattern, and a plurality of multi-diode microlenses, each multi-diode microlens of the plurality of multi-diode microlenses positioned above at least two adjacent color filters of the plurality of color filters, each of the at least two adjacent color filters configured to pass the same wavelengths of light, and formed such that light incident in a first direction is collected in a first diode of the at least two adjacent diodes and light incident in a second direction is collected in a second diode of the at least two adjacent diodes.

The following are non-limiting examples of some features and embodiments of such an image sensor. For example the wavelengths of light that the at least two adjacent color filters are configured to pass wavelengths can correspond to green light. At least one multi-diode microlens of the plurality of multi-diode microlenses can be a planoconvex lens having a circular perimeter sized to pass light to a 2×2 cluster of diodes of the plurality of diodes. At least one multi-diode microlens of the plurality of multi-diode microlenses can be a planoconvex lens an oval perimeter sized to pass light to a 2×1 cluster of diodes of the plurality of diodes. The plurality of diodes can form an array of a plurality of photodiodes formed in a semiconductor substrate, and each of the plurality of photodiodes can receive light from one of the plurality of microlenses.

Another innovation includes an image signal processor configured with instructions for performing a process for constructing a final image, the process including receiving image data from a plurality of diodes of an image sensor, the image data including a plurality of imaging pixel values from a first subset of the plurality of diodes associated with a plurality of color filters arranged in a Bayer pattern, and a plurality of phase detection pixel values from a second subset of the plurality of diodes associated with a plurality of color filters deviating from the Bayer pattern such that each of the plurality of phase detection pixel values comprises a green pixel value, the second subset of the plurality of diodes arranged in a plurality of groups of adjacent diodes, each group of the plurality of groups receiving light from a corresponding microlens formed such that light incident in a first direction is collected in a first diode of the group and light incident in a second direction is collected in a second diode of the group; calculating, for each of the plurality of groups of adjacent diodes, a single green pixel value corresponding to a location of the first diode of the group; calculating, for each of the plurality of groups of adjacent diodes, a missing blue or red pixel value corresponding to a location of the second diode of the group; and constructing the final image based at least partly on the plurality of imaging pixel values, the calculated missing blue or red pixel values, and the calculated single green pixel values.

The following are non-limiting examples of some features and embodiments of such an image signal processor. For example, a phase detection pixel value of the plurality of phase detection pixel values received from one diode of the plurality of diodes can have a brightness value similar to brightness values of imaging pixel values received from other diodes of the plurality of diodes adjacent to the one diode. Constructing the final image can be done at least partly via demosaicking. Calculating the single green pixel value for each of the plurality of groups of adjacent diodes can include summing values of values received from each diode in the group. Calculating the missing blue or red pixel value for each of the plurality of groups of adjacent diodes can include identifying, based on the Bayer pattern, whether the second diode corresponds to a blue pixel location or a red pixel location. When the second diode corresponds to the blue pixel, calculating the missing blue or red pixel value includes identifying, from the plurality of imaging pixel values, a plurality of blue pixel values within a predetermined neighborhood of the blue pixel location of the second diode; and interpolating a blue pixel value for the second diode based at least partly on the plurality of blue pixel values. The predetermined neighborhood can include values received from diodes within a 5×5 cluster having the second diode at its center. When the second diode corresponds to the red pixel, calculating the missing blue or red pixel value can include identifying, from the plurality of imaging pixel values, a plurality of red pixel values within a predetermined neighborhood of the red pixel location of the second diode; and interpolating a red pixel value for the second diode based at least partly on the plurality of red pixel values.

Another innovation includes an image capture apparatus including image capture means including a plurality of sensing means for sensing light from a target scene; a plurality of color filter means disposed above the plurality of sensing means, each of the plurality of color filter means positioned over one of the plurality of sensing means; a plurality of first light focusing means each positioned above one of the plurality of color filter means, a first subset of the plurality of color filter means corresponding to the plurality of first light focusing means arranged in a Bayer pattern; a plurality of second light focusing means for generating phase difference detection information, each of the plurality of second light focusing means positioned above at least two adjacent color filter means of the plurality of color filter means, each of the at least two adjacent color filter means configured to pass the same wavelengths of light, and formed such that light incident in a first direction is collected in a first sensing means of the at least two adjacent sensing means and light incident in a second direction is collected in a second sensing means of the at least two adjacent sensing means; and phase detection means configured to perform phase detection autofocus using values received from the at least two adjacent sensing means corresponding to one of the plurality of second light focusing means.

The following are non-limiting examples of some features and embodiments of such an image capture apparatus. For example, the image capture apparatus can include a primary focusing means positionable based at least partly on data received from the image signal processing means to produce an in-focus image of the target scene. The primary focusing means can include a movable lens assembly positioned above the plurality of color filter means. The primary focusing means can include a mechanism for moving the plurality of sensing means. The image capture apparatus can include interpolation means for calculating missing color values for some sensing means receiving light from the plurality of second light focusing means.

BRIEF DESCRIPTION OF THE DRAWINGS

The disclosed aspects will hereinafter be described in conjunction with the appended drawings and appendices, provided to illustrate and not to limit the disclosed aspects, wherein like designations denote like elements.

DETAILED DESCRIPTION

Introduction

Figure 1A:
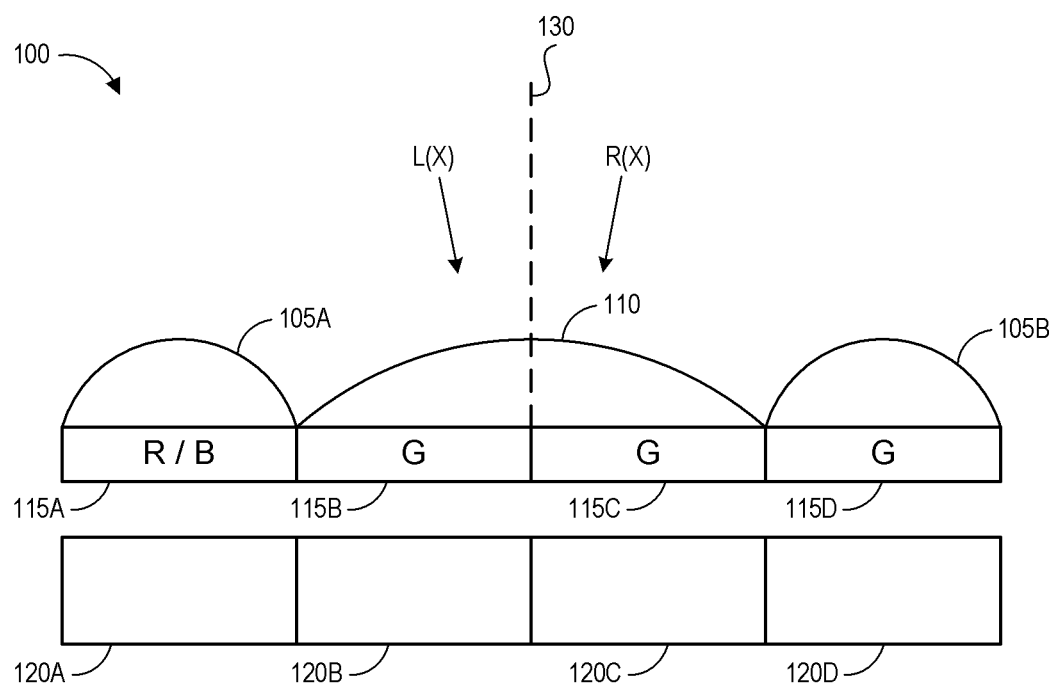
FIG. 1A depicts a schematic view of an example multi-diode microlens as described herein.

Embodiments of the disclosure relate to systems and techniques for mask-less phase detection pixels by using microlenses formed to extend over adjacent diodes in an image sensor (referred to herein as multi-pixel microlenses or multi-diode microlenses). The phase difference detection pixels below the multi-pixel microlenses are provided to obtain a phase difference signal indicating a shift direction (defocus direction) and a shift amount (defocus amount) of image focus.

Using such multi-pixel microlenses allows for full brightness of phase detection pixels, that is, similar brightness relative to adjacent imaging pixels, in contrast to reduced-brightness masked phase detection pixels. This can produce a final image with less artifacts compared to an image produced using a sensor with masked phase detection pixels, and can also produce better performance of phase detection autofocus in low-light settings. Such multi-pixel microlenses also provide for left and right phase detection pixels that are very close to one another, for example directly adjacent, providing more accurate phase detection information than traditional masked phase detection pixels that are spaced apart to reduce artifacts in the final image.

According to the designs described herein, color filters placed between a multi-pixel microlens and the corresponding diodes can be selected to pass the same wavelengths of light. Color filters placed between single-pixel microlenses and corresponding diodes can follow the standard Bayer pattern. By having only a single color "under" each multi-pixel microlens, a pixel color value can be more accurately calculated compared to a sensor having multiple color filter colors under a multi-pixel microlens. In one embodiment, color filters disposed between the multi-pixel microlens and the corresponding diodes can be selected to pass green light. Accordingly, green correction is trivial and the resulting image data does not lose any green pixel information by having defective or missing green pixel information, as green pixels are particularly important for human vision.

Because the color filters under a multi-pixel microlens all pass the same color of light, for example green, some of these green color filters deviate from the Bayer pattern thus producing "missing" color filters that would otherwise be present in a certain location according to the Bayer pattern. In some embodiments, the missing color filter that is replaced by the green color filter under the multi-pixel microlens can be a blue color filter, as the blue channel of image data is the least important for quality in terms of human vision. Further, by providing only minimal modifications (that is, at the locations of the multi-pixel microlenses) to the standard Bayer pattern, the resulting image data will be usable with conventional demosaicking algorithms. The missing color value can be interpolated and the interpolated value can be used to construct a final image. This can involve identifying, based on the Bayer pattern, whether the missing color corresponds to a blue pixel location or a red pixel location.

The multi-pixel microlenses can be formed over two adjacent pixels in a row or column, or can be formed over 2×2 groupings of four adjacent pixels in various implementations. Using 2×2 pixel microlenses can allow the autofocus algorithm to check for multiple directions: it can combine to create Left/Right, Up/Down and diagonals to improve robustness to edges in all orientations. A variety of patterns can be used for arranging individual microlenses, two-pixel microlenses, and 2×2 pixel microlenses. In some embodiments, a 2×1 microlens can be approximately 2 µm by 1 µm, depending upon the size of the diodes in the image sensor. In some embodiments, a 2×2 microlens can be approximately 2 µm by 2 µm, depending upon the size of the diodes in the image sensor.

Red, green, and blue as used herein to describe pixels or color filters refer to wavelength ranges roughly following the color receptors in the human eye. As a person of ordinary skill in the art will appreciate, exact beginning and ending wavelengths (or portions of the electromagnetic spectrum) that define colors of light (for example, red, green, and blue light) are not typically defined to be a single wavelength. Each color filter can have a spectral response function within the visible spectrum, and each color channel resulting from placement of a color filter over a portion of the image sensor can have a typical human response function. Image sensor filter responses are more or less the same, however may change from sensor to sensor. The image sensors used to capture phase detection autofocus information as described herein may be used in conjunction with a color filter array (CFA) or color filter mosaic (CFM). Such color filters split all incoming light in the visible range into red, green, and blue categories to direct the split light to dedicated red, green, or blue photodiode receptors on the image sensor. As such, the wavelength ranges of the color filter can determine the wavelength ranges represented by each color channel in the captured image. Accordingly, a red channel of an image may correspond to the red wavelength region of the color filter and can include some yellow and orange light, ranging from approximately 570 nm to approximately 760 nm in various embodiments. A green channel of an image may correspond to a green wavelength region of a color filter and can include some yellow light, ranging from approximately 570 nm to approximately 480 nm in various embodiments. A blue channel of an image may correspond to a blue wavelength region of a color filter and can include some violet light, ranging from approximately 490 nm to approximately 400 nm in various embodiments.

Although discussed herein primarily in the context of phase detection autofocus, the phase detection image sensors and techniques described herein can be used in other contexts, for example generation of stereoscopic image pairs or sets.

Various embodiments will be described below in conjunction with the drawings for purposes of illustration. It should be appreciated that many other implementations of the disclosed concepts are possible, and various advantages can be achieved with the disclosed implementations. Headings are included herein for reference and to aid in locating various sections. These headings are not intended to limit the scope of the concepts described with respect thereto. Such concepts may have applicability throughout the entire specification.

Overview of Example Phase Detection Microlens and Color Filter Arrangements

FIG. 1A depicts a schematic view of an example sensor portion 100 including a multi-diode microlens 110 as described herein. The sensor portion includes single-diode microlenses 105A, 105B, multi-diode microlens 110, color filters 115A-115D, and photodiodes ("diodes") 120A-120D. Multi-diode microlens 110 is sized and positioned such that incoming light from a target scene propagates through the multi-diode microlens 110 before falling incident on the diodes 120B, 120C covered by the multi-diode microlens 110.

The diodes can be, for example, photodiodes formed in a semiconductor substrate, for example in a complementary metal-oxide semiconductor (CMOS) image sensor. As used herein, diode refers to a single unit of any material, semiconductor, sensor element or other device that converts incident light into current. The term "pixel" as used herein can refer to a single diode in the context of its sensing functionality due to adjacent optical elements such as color filters or microlenses. Accordingly, although "pixel" generally may refer to a display picture element, a "pixel" as used herein may refer to a sensor (for example, a photodiode) that receives light and generates a signal which if rendered on a display, may be displayed as a point in an image captured by the sensor (and a plurality of other sensors). The individual units or sensing elements of an array of sensors, for example in a CMOS or charge-coupled (CCD) device, can also be referred to as sensels.

Color filters 115A-115D act as wavelength-selective pass filters and split incoming light in the visible range into red, green, and blue ranges (as indicated by the R, G, and B notation used throughout the Figures). The light is "split" by allowing only certain selected wavelengths to pass through the color filters 115A-115D. The split light is received by dedicated red, green, or blue diodes 120A-120D on the image sensor. Although red, blue, and green color filters are commonly used, in other embodiments the color filters can vary according to the color channel requirements of the captured image data, for example including ultraviolet, infrared, or near-infrared pass filters.

Each single-diode microlens 105A, 105B is positioned over a single color filter 115A, 115D and a single diode 120A, 120D. Diodes 120A, 120D accordingly provide imaging pixel information. Multi-diode microlens 110 is positioned over two adjacent color filters 115B, 115C and two corresponding adjacent diodes 120B, 120C. Diodes 120B, 120C accordingly provide phase detection pixel information by diode 120B receiving light entering multi-diode microlens 110 in a first direction and diode 120C receiving light entering multi-diode microlens 110 in a second direction. In some embodiments, the multi-diode microlens 110 can be a planoconvex lens having a circular perimeter, the at least one multi-diode microlens sized to pass light to a 2×2 cluster of diodes of the plurality of diodes. In other embodiments, the multi-diode microlens 110 can be a planoconvex lens having an oval perimeter, the at least one multi-diode microlens sized to pass light to a 2×1 cluster of diodes of the plurality of diodes.

As used herein, "over" and "above" refer to the position of a structure (for example, a color filter or lens) such that light incident from a target scene propagates through the structure before it reaches (or is incident on) another structure. To illustrate, the microlens array 105A, 110, 105B is positioned above the color filter array 115A-115D, which is positioned above the diodes 120A-120D. Accordingly, light from the target scene first passes through the microlens array 105A, 110, 105B, then the color filter array 115A-115D, and finally is incident on the diodes 115A-115D.

Placement of the microlenses above each photodiode 120A-120D redirects and focuses the light onto the active detector regions. Each microlens may be formed by dropping the lens material in liquid form onto the color filters 115A-115D on which the lens material solidifies. In other embodiments, wafer-level optics can be used to create a one or two dimensional array of microlenses using semiconductor-like techniques, where a first subset of the microlenses in the array include single-diode microlenses and a second subset of the microlenses in the array include multi-diode microlenses. As illustrated by single-diode microlens 105A, 105B and multi-diode microlens 110, each microlens may be a single element with one planar surface and one spherical convex surface to refract the light. Other embodiments of the microlenses may use aspherical surfaces, and some embodiments may use several layers of optical material to achieve their design performance.

Color filters 115A, 115D under single-diode microlenses 105A, 105B can be positioned according to the Bayer pattern in some embodiments. Accordingly, color filter 115A is either a red color filter or a blue color filter, while color filter 115D is a green color filter. Preserving the Bayer pattern for diodes 120A, 120B, 120D and other diodes under single-diode microlenses can provide computational benefits, for example enabling use of widespread demosaicking techniques on captured image data. The Bayer pattern is a specific pattern for arranging RGB color filters on a rectangular grid of photosensors. The particular arrangement of color filters of the Bayer pattern is used in most single-chip digital image sensors used in digital cameras, camcorders, and scanners to create a color image. The Bayer pattern is 50% green, 25% red and 25% blue with rows of repeating red and green color filters alternating with rows of repeating blue and green color filters.

Although the color filters over which the single-diode microlenses 105A, 105B are positioned are described herein in the context of the Bayer pattern arrangement, such color filters can be arranged in other patterns that are 50% green color filters 25% blue color filters and 25% red color filters, other patterns that include more green color filters than blue or red color filters, or other patterns that have generally twice as many green color filters as blue or red color filters. The color filters can also be positioned according to other color filter patterns in some embodiments, for example color filter patterns designed for use with panchromatic diodes (sensitive to all visible wavelengths) and/or color filters for passing light outside of the visible spectrum.

As depicted with green color filter 115C, a least some of the color filters 115B, 115C positioned below the multi-diode microlens 110 may be different from a color filter that would otherwise be positioned in that location according to the Bayer pattern. As in the illustrated embodiment, color filters 115B, 115C between the multi-diode microlens 110 and the corresponding diodes 120B, 120C can be selected to pass green light. Accordingly, green correction is trivial as a full green pixel can be reconstructed by combining the values from diodes 120B, 120C. As such, the resulting image data does not lose any green channel information by having defective or missing green pixel information, as the green channel is particularly important for human vision.

One possible concern is that this center green location can be shifted horizontally by ½ pixel from the original green pixel location in the Bayer pattern, however this offset may not have noticeable consequences with respect to quality of the final image. The example of combining the values from diodes 120B, 120C is provided to explain one process for performing green correction via simple interpolation (summing), however in other implementations green correction can be performed via higher order green interpolation (using additional green pixels in a predefined neighborhood).

In some embodiments, the "missing" color filter that is replaced by the green color filter 115C under the multi-pixel microlens can be a blue color filter, as the blue channel of image data is the least important for quality in terms of human vision. In other embodiments, green color filter 115C can be in the location where a red color filter would be if not for interruption of the color filter pattern due to the multi-diode microlens 110. Such color filter selections can be used, for example, in image sensors designed for common photography applications. In image sensors for other applications, image data color channels and color channel importance may vary and the color filter selections can vary accordingly.

FIG. 1A depicts (dashed) line 130 which should be understood is not a physical structure but rather is depicted to illustrate the phase detection capabilities provided by multi-diode microlens 110. The line 130 passes through the optical center of the multi-diode microlens 110 and passes orthogonally to a plane formed by the color filter array of color filters 115A-115D. Where multi-diode microlens is a 2×1 microlens, the multi-diode microlens 110 is formed such that light L(x) incident in a first direction, that is, entering the multi-diode microlens 110 from one side of the line 130, is collected in a first diode 120B. Light incident in a second direction, that is, entering the multi-diode microlens 110 from the other side of the line 130, is collected in a second diode 120C. Accordingly, data received from diodes 120B, 120C can be used for phase detection. Where multi-diode microlens is a 2×2 microlens, the multi-diode microlens 110 is formed such that light L(x) incident in four directions, with a direction considered as light passing through a quarter of the multi-diode microlens 110, is incident on four diodes.

Figure 1B:
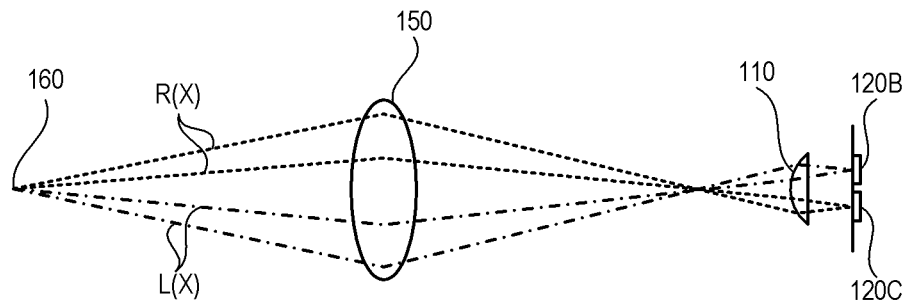
FIG. 1B depicts an example ray trace of light entering a pair of phase detection diodes.
Figure 1C:
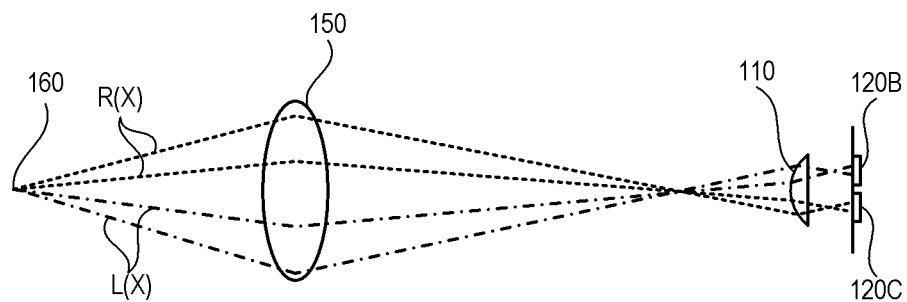
FIG. 1C depicts an example ray trace of light entering a pair of phase detection diodes.
Figure 1D:
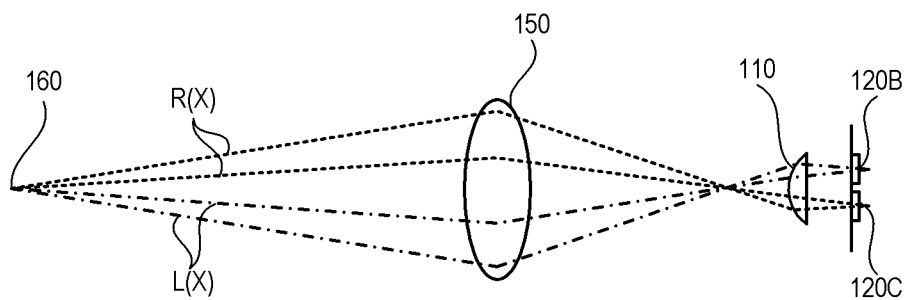
FIG. 1D depicts an example ray trace of light entering a pair of phase detection diodes.

FIGS. 1B-1D depict example ray traces of light traveling through a main lens 150 then through a multi-diode microlens 110 before falling incident on a pair of phase detection diodes 120B, 120C. It will be appreciated that the dimensions of the main lens 150 and the multi-diode microlens 110 are not shown to scale. The diameter of the multi-diode microlens 110 can be approximately equal to the distance spanning two adjacent diodes of an image sensor, while the diameter of the main lens 150 can be equal to or greater than the width (the distance along a row or column of diodes) of the image sensor.

Specifically, FIG. 1B depicts an example ray trace of an in-focus condition, FIG. 1C depicts an example ray trace of a front-focus condition, and FIG. 1D depicts an example ray trace of a back-focus condition. Light travels from a point 160 in a target scene, travels through lens 150 for focusing the target scene onto an image sensor including the phase detection diodes 120B, 120C, and passes through the multi-diode microlens 110 before falling incident the phase detection diodes 120B, 120C. As illustrated, diode 120B receives light from a left direction L(x) of the main lens 150 and diode 120C receives light from a right direction R(x) of the main lens 150. In some embodiments light from the left direction L(x) can be light from a left half (depicted as the lower half in the illustration of FIGS. 1B-1C) of the main lens 150 and light from the right direction R(x) can be light from a right half (depicted as the upper half in the illustration of FIGS. 1B-1C) of the main lens 150. Accordingly, a number of phase detection diodes interleaved with imaging diodes across the image sensor can be used to extract left and right images that are offset from a center image captured by the imaging diodes. Rather than right and left, other embodiments can use up and down images, diagonal images, or a combination of left/right, up/down, and diagonal images for calculating autofocus adjustments.

When the image is in focus, the left rays L(x) and right rays R(x) converge at the plane of the phase detection diodes 115B, 115C. As illustrated in FIGS. 1C and 1D, in front and back defocus positions the rays converge before and after the plane of the diodes, respectively. As described above, signals from the phase detection diodes can be used to generate left and right images that are offset from the center image in front or back defocus positions, and the offset amount can be used to determine an autofocus adjustment for the main lens 150. The main lens 150 can be moved forward (toward the image sensor) or backward (away from the image sensor) depending on whether the focal point is in front of the subject (closer to the image sensor), or behind the subject (farther away from the image sensor). Because the autofocus process can figure out both the direction and amount of movement for main lens 150, phase-difference autofocus can focus very quickly.

Figure 2:
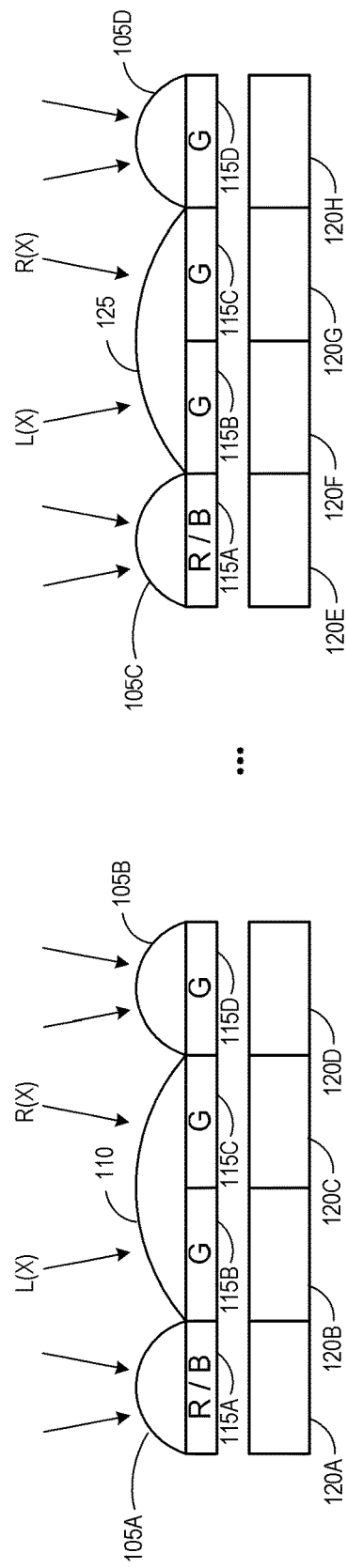
FIG. 2 depicts a schematic illustrating an example of phase detection using the example multi-diode microlens of FIG. 1A.

FIG. 2 depicts a schematic example of phase detection using the example multi-diode microlens of FIG. 1A. FIG. 2 illustrates that the image sensor may include other phase detection locations, as shown by having additional single-diode microlenses 105C, 105D, additional multi-diode microlens 125, additional color filters 115E-H, and additional diodes 120E-H.

Incoming light is represented by arrows, and is understood to be incident from a target scene. As used herein, "target scene" refers to any scene or area having objects reflecting or emitting light that is sensed by the image sensor, or any other phenomena viewable by the image sensor. Light from the target scene propagates toward diodes 120A-120H, and is incident on the diodes after first passing through the microlenses and then the color filter array.

To perform phase detection, the imaging system can save two images containing only values received from the phase detection diodes 120B, 120C, 120F, 120G: image L(x) for left side data and image R(x) for right side data. Diode 120B receives light entering multi-diode microlens 110 from the left side direction and diode 120C receives light entering multi-diode microlens 110 from the right side direction. Similarly, diode 120F receives light entering multi-diode microlens 125 from the left side direction and diode 120G receives light entering multi-diode microlens 125 from the right side direction. Any number of multi-diode microlenses can be disposed over an image sensor ranging from one to all of the microlenses of the sensor, based on balancing the considerations of more multi-diode microlenses providing more reliable phase detection autofocus data but requiring greater amounts of computation for pixel value calculations and also increasing the likelihood of artifacts in a final image.

Focus can be calculated by applying a cross-correlation function to the data representing the left and right images. If the distance between the two images is narrower than the corresponding distance in an in-focus condition, the autofocus system determines that the focal point is in front of the subject. If the distance is wider than the reference value, the system determines that the focal point is behind the subject.

The autofocus system can compute how much the lens position (or sensor position, in embodiments having a movable sensor) should be moved and in which direction and provide this information to the lens actuator to move the lens accordingly, providing for fast focusing. The above-described process can be performed by the image signal processor 620 of FIG. 6 in some examples.

Figure 3A:
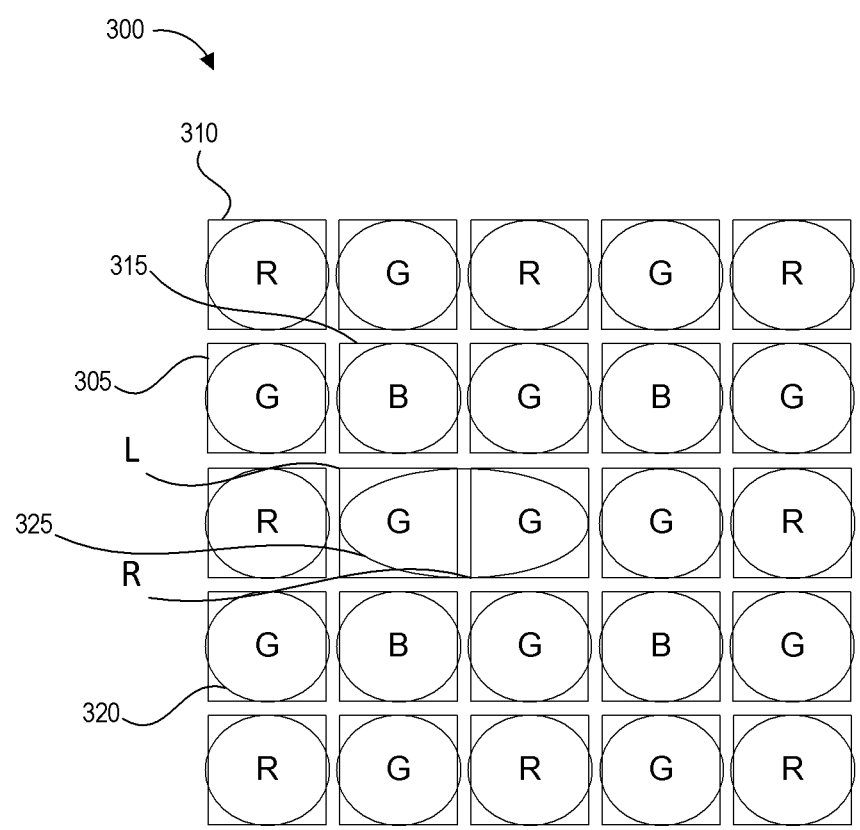
FIG. 3A depicts an example arrangement of color filters, single-diode microlenses, and a multi-diode microlens for a phase detection image sensor as described herein.

FIG. 3A depicts an example arrangement of color filters 305, 310, 315, single-diode microlenses 320, and a multi-diode microlens 325 for a phase detection image sensor 300 as described herein. Only a portion of sensor 300 is illustrated, and this portion can be repeated across the sensor array or interspersed in selected phase detection locations in the Bayer pattern depending on the desired balance between number of phase detection pixels and image quality.

As illustrated, a number of green color filters 305, red color filters 310, and blue color filters 315 are arranged in the Bayer pattern under a number of single-diode microlenses 320. Each color filter is called out once using reference numbers 305, 310, or 315 and shown throughout the remainder of FIGS. 3A-3C using G, R, or B for simplicity of the illustration. However, at the location of the multi-diode microlens 325 the Bayer pattern is interrupted and an additional green color filter is inserted at the location of the right (R) phase detection pixel. As such, there is a "missing" red filter at the location of the right phase detection pixel. In the illustrated embodiment, the right phase detection pixel green color filter replaces what would otherwise, according to the Bayer pattern, be a red color filter. In other embodiments the phase detection pixel green color filter can replace a blue color filter.

Figure 3B:
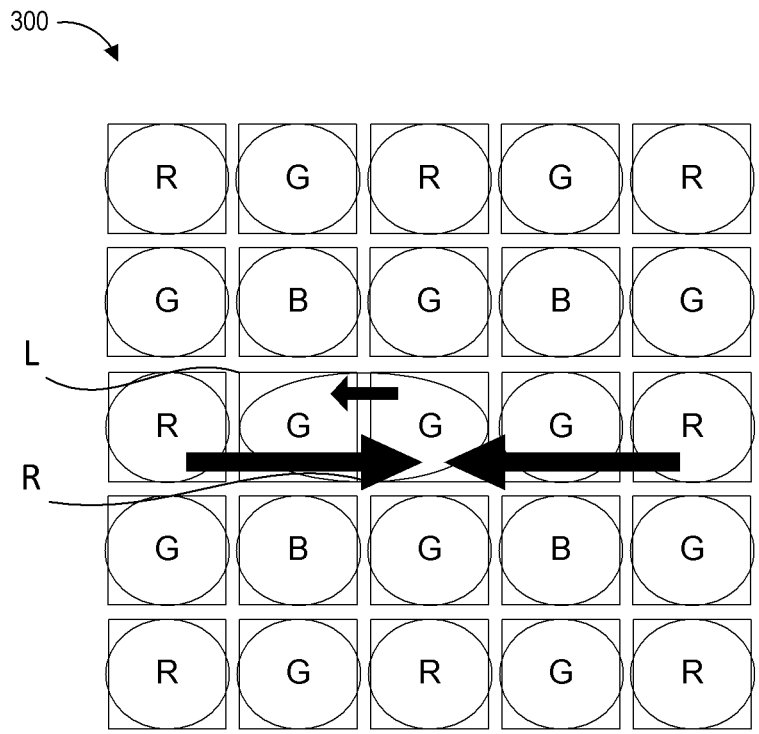
FIG. 3B depicts a representation of an example of interpolation to determine values that correspond to a sensor under the multi-diode microlens of FIG. 3A.

FIG. 3B depicts a representation of an example of interpolation for values under the multi-diode microlens 325 of FIG. 3A. Such interpolation can provide pixel values (representing color and brightness of the phase detection pixels) for output to a demosaicking process for use in generating a final image of the target scene, and can be performed by image signal processor 620 of FIG. 6 in some embodiments.

As illustrated, the left phase detection pixel (L) value can be determined by summing the green values of the left and right phase detection pixels under the microlens 325. The summed green value is assigned to the left phase detection pixel as the Bayer pattern used to arrange the color filters under the single-diode microlenses specifies a green pixel in the location of the left phase detection pixel. The small phase shift of the summed green value may provide improved green aliasing. Accordingly, green compensation is trivial, meaning that it does not require extensive computation, and may even be performed on-sensor in some embodiments. In some embodiments, the summed value may be divided by the number of diodes under the microlens (here, two) to obtain the green value.

As illustrated, the right phase detection pixel value can be determined by interpolation using two nearby red pixel values (values received from the diodes under red color filters). Two horizontally located red pixels are illustrated for the interpolation, however alternatively or additionally two vertically located red pixels can be used. The interpolated value is assigned to the right phase detection pixel as the Bayer pattern used to arrange the color filters under the single-diode microlenses specifies a red pixel in the location of the right phase detection pixel.

In some embodiments, horizontal interpolation as depicted for the green value and missing pixel value of FIG. 3B does not require any line buffers, can be made prior to the standard demosaicking process, and can even be performed on-sensor.

Figure 3C:
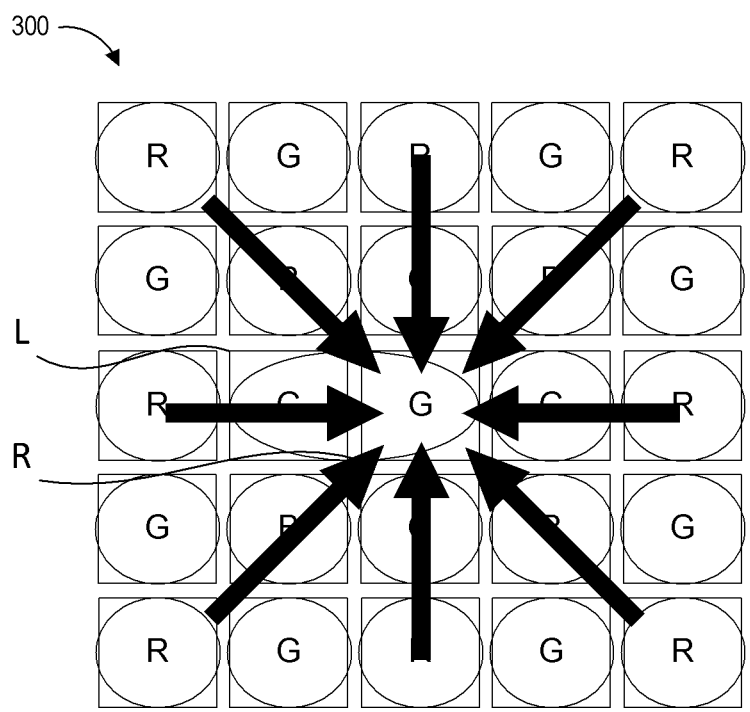
FIG. 3C depicts a representation of another example of interpolation for values under the multi-diode microlens of FIG. 3A.
Figure 6:
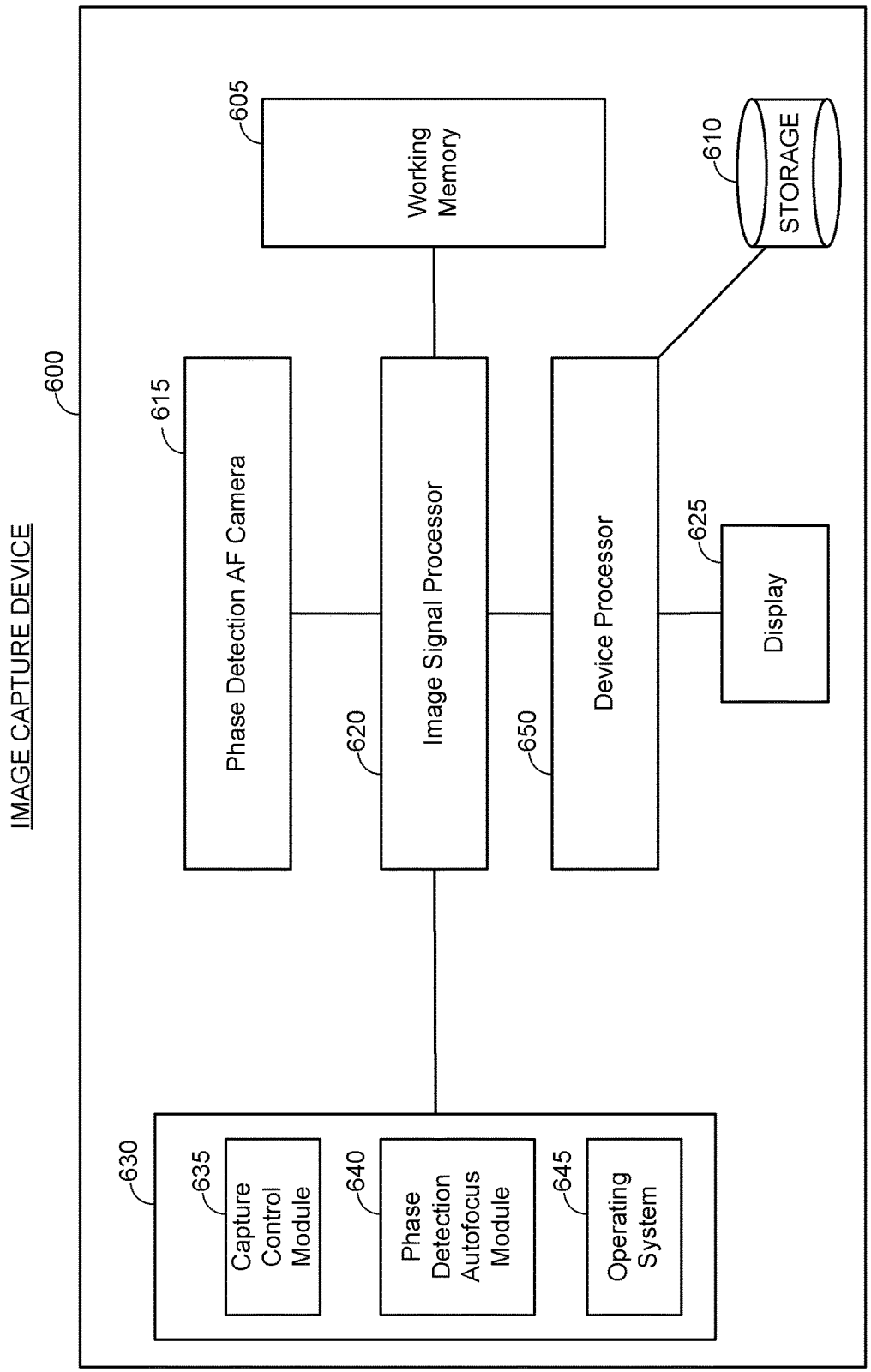
FIG. 6 depicts a schematic block diagram illustrating an example of an imaging system equipped with the phase detection autofocus devices and techniques.

FIG. 3C depicts a representation of another example of interpolation for values under the multi-diode microlens 325 of FIG. 3A, and can be performed by image signal processor 620 of FIG. 6 in some embodiments. Here, red values received from eight diodes under red color filters (referred to as "red pixel values") in a 5×5 neighborhood with the right phase detection pixel at its center are used to interpolate the "missing" red pixel value. In other implementations, data from a different predetermined neighborhood of surrounding diodes can be used for interpolation, for example four neighboring red pixel values. Although FIGS. 3B and 3C present two options for interpolating the missing pixel color value, other interpolation techniques can be suitable, for example using greater or fewer numbers of pixel values for the interpolation. Further, in some embodiments, the pixel having the "missing" color filter can be designated as a defective pixel and a defective pixel compensation process can be used to determine its value.

The decision regarding which neighboring pixels to use for calculating the "missing" pixel value can be predetermined or can be adaptively selected from a range of pre-identified alternatives, for example based on calculated edge data.

Figure 4A:
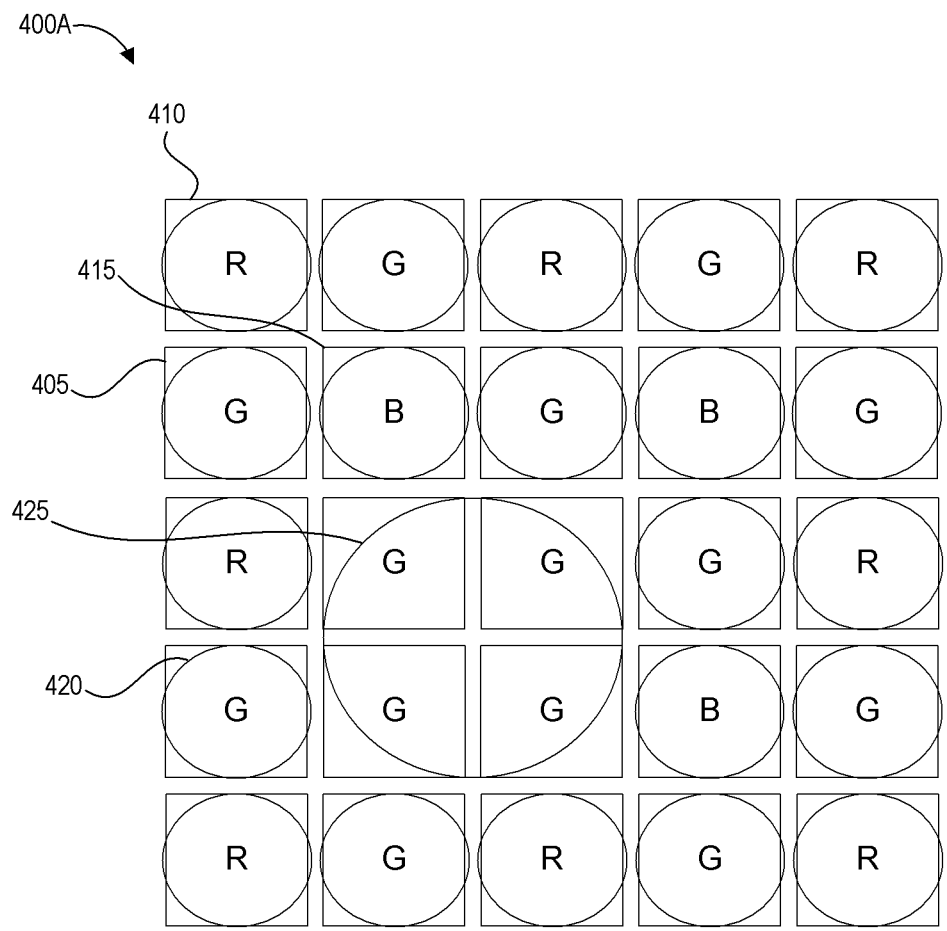
FIG. 4A depicts another example arrangement of color filters, single-diode microlenses, and a multi-diode microlens for a phase detection image sensor.

FIG. 4A depicts another example arrangement 400A of green color filters 405, red color filters 410, blue color filters 415, single-diode microlenses 420, and a multi-diode microlens 425 for a phase detection image sensor as described herein. The color filters under the single-diode microlenses 420 are arranged in the Bayer pattern. Here, the multi-diode microlens 425 is positioned over a 2×2 cluster of color filters and associated diodes. According to the color filter arrangement of the present disclosure, all four color filters under the multi-diode microlens 425 are selected to pass the same wavelength (or range of wavelengths) of light, here depicted as green light.

Because multi-diode microlens 425 covers a 2×2 cluster, the underlying phase detection pixels can be used to form multiple pairs, for example two left-right pairs providing left phase image data and right phase image data, or two up-down pairs providing upper phase image data and lower phase image data. Diagonal pairs can also be used. In some embodiments, a robust phase detection focus process can use left-right and up-down, or left-right, up-down and diagonal, phase detection pair data for calculating autofocus. This can improve robustness of the phase detection autofocus process to edges in all directions. For example, an image with all vertical edges (consider the example of a target scene including the pylons of a pier) may lack significant left-right phase detection information received from the configurations of FIGS. 3A-3C, however by using a multi-diode microlenses 425 the phase detection can become robust to edges in all directions.

When color values are output for demosaicking to produce the final image, the upper right phase detection pixel can have an interpolated red color value and the lower left phase detection pixel can have an interpolated blue color value, according to the "missing" colors that are predicted for those locations by the Bayer pattern present under the single-diode microlenses. Green values for the upper left phase detection pixel and lower right phase detection pixel can be calculated using the green values received from some or all of the diodes that receive light from the multi-diode microlens 425. For example, a cumulative green value can be calculated by summing values from all four diodes under the multi-diode microlens 425. The values for each green location (as determined from the Bayer pattern) under the multi-diode microlens 425 can be interpolated based on the cumulative green value and three immediate green diagonal neighbors to the green location. The red and blue locations under the multi-diode microlens 425 can be interpolated, for example, based on four closest red and blue neighbors, respectively or based on a larger predetermined neighborhood.

Figure 4B:
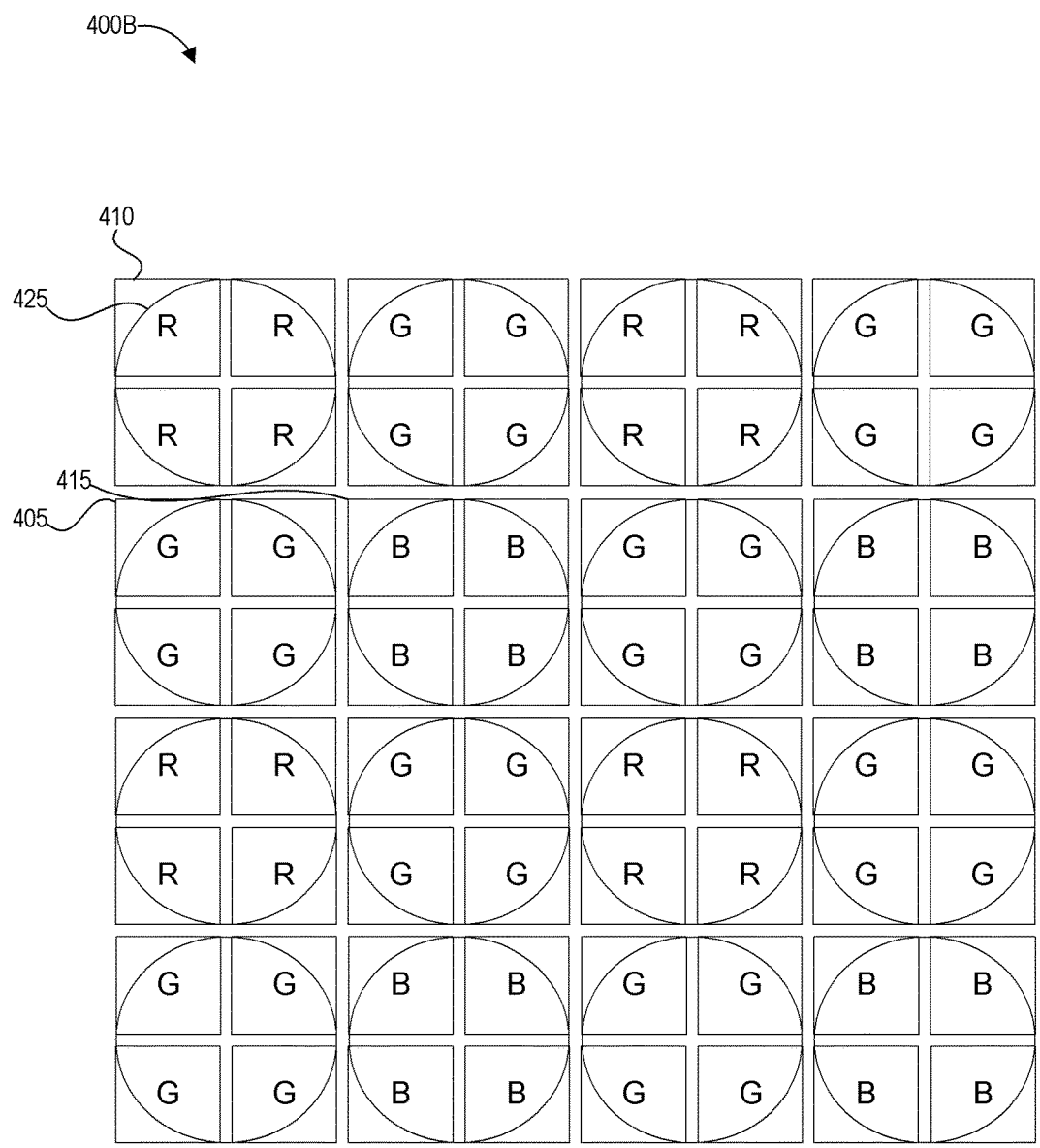
FIG. 4B depicts an example arrangement of color filters and a multi-diode microlenses for a phase detection image sensor.

FIG. 4B depicts an example arrangement 400B of green color filters 405, red color filters 410, blue color filters 415, and multi-diode microlenses 425 for a phase detection image sensor as described herein. In the arrangement 400B of FIG. 4B, no single-diode microlenses are present. Each 2×2 multi-diode microlens 425 has only a single color of color filters positioned beneath it such that all diodes beneath the multi-diode microlens 425 receive the same wavelength of light. Each multi-diode microlenses 425 provides the same multi-directional phase detection benefits discussed above with respect to FIG. 4A. Further, such round multi-diode microlenses 425 may be easier to manufacture with the desired optical quality, via nano-manufacturing techniques that place liquid lens material droplets onto the color filter array to harden into the microlenses, than 2×1 oval lenses. Each multi-diode microlenses 425 can have a diameter between 0.9 μm and 1.1 μm in some embodiments.

With respect, generally, to sensor manufacturing, pixel size is not expected to shrink significantly as current pixel sizes are already reaching the diffraction limit. Based on this current sensor form factor effective resolution is not expected to grow. However, the CMOS manufacturing process is still improving. The additional shrunk logic from the improved manufacturing can be used for implementing a multi diode phase detection scheme using a sensor having the arrangement 400B of FIG. 4B. For example, image sensor bus speed can still increase and can be used to transfer more data from the sensor. The four diodes beneath each of the multi-diode microlenses 425 can use 4-pixel logic sharing readout architecture.

The clusters of color filters in FIG. 4B are arranged similarly to the Bayer pattern, such that the clusters defined by the multi-diode microlenses 425 follow the Bayer pattern. Accordingly, when the color values are output for demosaicking, no "missing" pixel values require interpolation and no artifacts require correction. The regular Bayer pattern can be produced by summing the values received from the diodes under each of the multi-diode microlenses 425.

Overview of Example Phase Detection Autofocus Process

Figure 5:
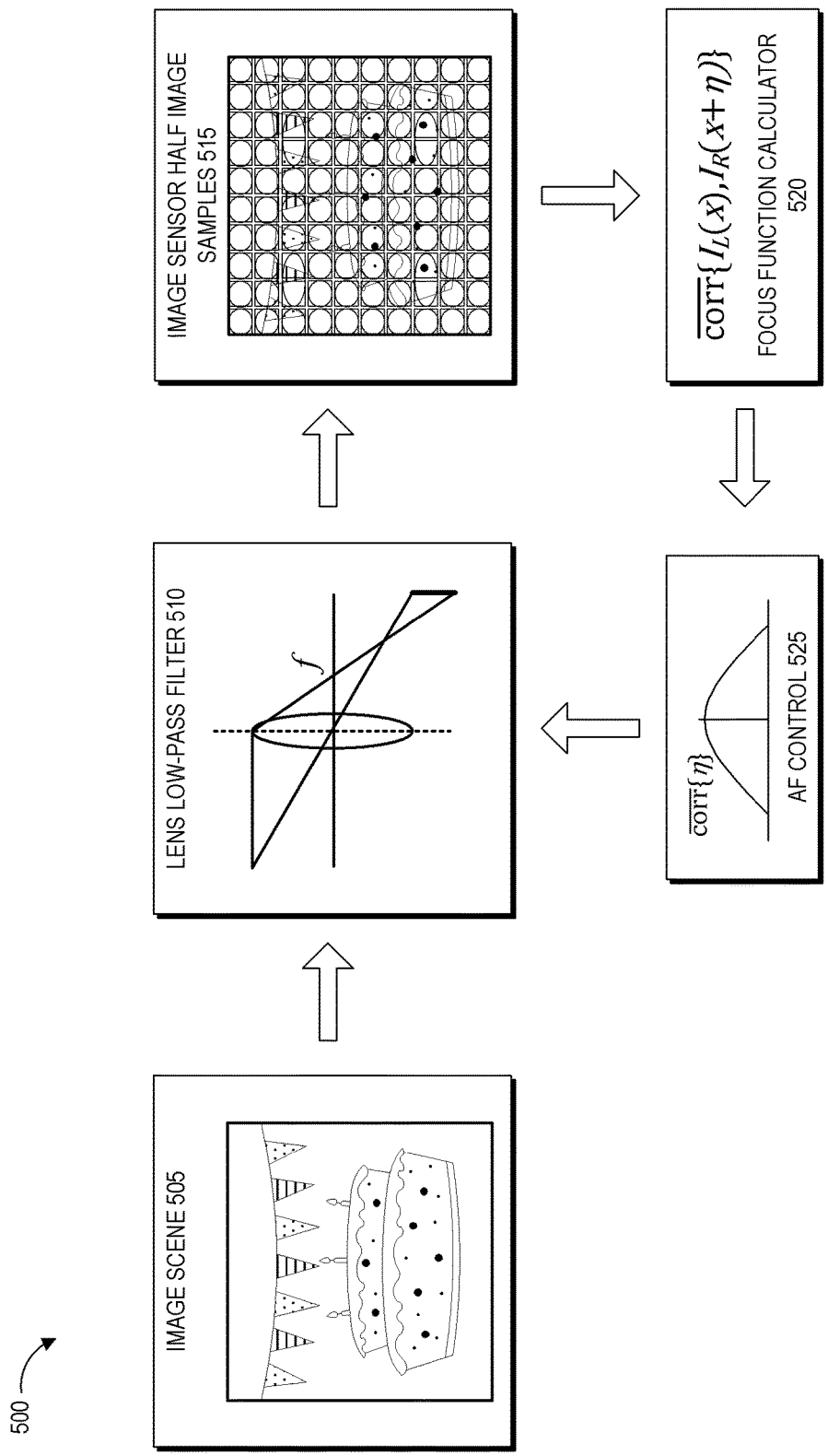
FIG. 5 depicts a high-level overview of an example phase detection autofocus process using a sensor having the multi-diode microlenses.

FIG. 5 depicts a high-level overview of an example phase detection autofocus process 500 using a sensor having the multi-diode microlenses described herein. In one embodiment, the process 500 can be performed on-sensor. In other implementations, the process 500 can involve one or more processors, for example image signal processor 620 of FIG. 6. Light representing the target scene 505 is passed through the lens assembly 510 and received by the image sensor, where half-image samples 515 are produced using the multi-diode microlenses described above. Because the dimensions of the lens assembly 510 and sensor are larger than the length of the light-wave, the lens assembly 510 can be modeled as a linear low-pass filter with a symmetric impulse response, wherein the impulse response (also referred to as the point spread function) of the lens assembly 510 is of a rectangular shape with a width parameter proportional to the distance between the sensor and the image plane. The scene is "in focus" when the sensor is in the image plane, that is, in the plane where all rays from a single point at the scene converge into a single point. As shown in FIG. 2, the half-image samples can save two images containing only information from the phase detection pixels. The half-images can be considered as convolutions of the target scene with left and right (or, in other examples, up and down) impulse responses of the lens assembly 510. In sensor embodiments using the arrangements of FIGS. 4A and 4B, more partial images can be saved.

A focus function calculator 520 applies a cross-correlation function to the partial images to determine disparity. The cross-correlation function of the left and right impulse responses of the lens assembly 510 can be approximately symmetric and unimodal, however due to the nature of the target scene 505, the cross-correlation function as applied to the left and right captured images may have one or more false local maxima. Various approaches can be used to identify the true maximum of the cross-correlation function. The result of the cross-correlation function is provided as feedback to the autofocus control 525, which can be used to drive a lens actuator to move the primary focusing lens assembly 510 to a desired focus position. Other embodiments may use a stationary primary focusing lens assembly and move the image sensor to the desired focus position. Accordingly, in the phase detection autofocus process 500, focusing is equivalent to searching for the cross-correlation function maximum. This is a fast process that can be done quickly enough to provide focus adjustment for each frame at typical frame rates, for example at 30 frames per second, and thus can be used to provide smooth autofocusing for video capture. Some implementations combine phase detection autofocus with contrast-based autofocus techniques, for example to increase accuracy.

When the primary focusing lens assembly and/or image sensor are in the desired focus position, the image sensor can capture in-focus imaging pixel information and phase detection pixel information and, as described above, calculate and interpolate color values for the phase detection pixels. The imaging pixel values and determined phase detection pixel values can be output for demosaicking and, optionally, other image processing techniques to generate a final image of the target scene.

Overview of Example Phase Detection Autofocus Process

FIG. 6 illustrates a high-level schematic block diagram of an embodiment of an image capture device 600 having multispectral iris authentication capabilities, the image capture device 600 having a set of components including an image signal processor 620 linked to a phase detection autofocus camera 615. The image signal processor 620 is also in communication with a working memory 605, memory 630, and device processor 650, which in turn is in communication with storage module 610 and an optional electronic display 625.

Image capture device 600 may be a portable personal computing device such as a mobile phone, digital camera, tablet computer, personal digital assistant, or the like. There are many portable computing devices in which using the phase detection autofocus techniques as described herein would provide advantages. Image capture device 600 may also be a stationary computing device or any device in which the multispectral iris verification techniques would be advantageous. A plurality of applications may be available to the user on image capture device 600. These applications may include traditional photographic and video applications as well as data storage applications and network applications.

The image capture device 600 includes phase detection autofocus camera 615 for capturing external images. The phase detection autofocus camera 615 can include an image sensor having multi-diode microlenses and color filters arranged according to the embodiments described above. The phase detection autofocus camera 615 can also have a primary focusing mechanism positionable based at least partly on data received from the image signal processor 620 to produce an in-focus image of the target scene. In some embodiments, the primary focusing mechanism can be a movable lens assembly positioned to pass light from the target scene to the sensor. In some embodiments, the primary focusing mechanism can be a mechanism for moving the sensor.

The sensor of the phase detection autofocus camera 615 can have different processing functionalities in different implementations. In one implementation, the sensor may not process any data, and the image signal processor 620 may perform all needed data processing. In another implementation, the sensor may be capable of extracting phase detection pixels, for example into a separate Mobile Industry Processor Interface (MIPI) channel. Further, the sensor may additionally be capable of interpolating missing pixel values, for example in a RAW channel. In some implementations the sensor may additionally be capable of interpolating missing pixel values, for example in a normal channel, and may be able to process the whole phase detection calculation internally (on-sensor). For example, the sensor may include analog circuitry for performing sums, subtractions, and/or comparisons of values received from diodes. An imaging apparatus as described herein may include an image sensor capable of performing all phase detection calculations or an image sensor capable of performing some or no processing together with an image signal processor 620 and/or device processor 650.

The image signal processor 620 may be configured to perform various processing operations on received image data in order to execute phase detection autofocus and image processing techniques. Image signal processor 620 may be a general purpose processing unit or a processor specially designed for imaging applications. Examples of image processing operations include demosaicking, white balance, cross talk reduction, cropping, scaling (e.g., to a different resolution), image stitching, image format conversion, color interpolation, color processing, image filtering (e.g., spatial image filtering), lens artifact or defect correction, etc. The image signal processor 620 can also control image capture parameters such as autofocus and auto-exposure. Image signal processor 620 may, in some embodiments, comprise a plurality of processors. Image signal processor 620 may be one or more dedicated image signal processors (ISPs) or a software implementation of a processor. In some embodiments, the image signal processor 620 may be optional for phase detection operations, as some or all of the phase detection operations can be performed on the image sensor.

As shown, the image signal processor 620 is connected to a memory 630 and a working memory 605. In the illustrated embodiment, the memory 630 stores capture control module 635, phase detection autofocus module 640, and operating system module 645. The modules of the memory 630 include instructions that configure the image signal processor 620 of device processor 650 to perform various image processing and device management tasks. Working memory 605 may be used by image signal processor 620 to store a working set of processor instructions contained in the modules of memory. Alternatively, working memory 605 may also be used by image signal processor 620 to store dynamic data created during the operation of image capture device 600.

As mentioned above, the image signal processor 620 is configured by several modules stored in the memories. The capture control module 635 may include instructions that configure the image signal processor 620 to adjust the focus position of phase detection autofocus camera 615, for example in response to instructions generated during a phase detection autofocus technique. Capture control module 635 may further include instructions that control the overall image capture functions of the image capture device 600. For example, capture control module 635 may include instructions that call subroutines to configure the image signal processor 620 to capture multispectral image data including one or more frames of a target scene using the phase detection autofocus camera 615. In one embodiment, capture control module 635 may call the phase detection autofocus module 240 to calculate lens or sensor movement needed to achieve a desired autofocus position and output the needed movement to the imaging processor 220. Capture control module 635 may call the phase detection autofocus module 240 to interpolate color values for pixels positioned beneath multi-pixel microlenses.

Accordingly, phase detection autofocus module 640 can store instructions for executing phase detection autofocus. Phase detection autofocus module 640 can also store instructions for calculating color values for phase detection pixels and for image generation based on phase detection pixel values and imaging pixel values.

Operating system module 645 configures the image signal processor 620 to manage the working memory 605 and the processing resources of image capture device 600. For example, operating system module 645 may include device drivers to manage hardware resources such as the phase detection autofocus camera 615. Therefore, in some embodiments, instructions contained in the image processing modules discussed above may not interact with these hardware resources directly, but instead interact through standard subroutines or APIs located in operating system component 650. Instructions within operating system 645 may then interact directly with these hardware components. Operating system module 645 may further configure the image signal processor 620 to share information with device processor 650.

Device processor 650 may be configured to control the display 625 to display the captured image, or a preview of the captured image, to a user. The display 625 may be external to the imaging device 200 or may be part of the imaging device 200. The display 625 may also be configured to provide a view finder displaying a preview image for a use prior to capturing an image, for example to assist the user in aligning the image sensor field of view with the user's eye, or may be configured to display a captured image stored in memory or recently captured by the user. The display 625 may comprise an LCD, LED, or OLED screen, and may implement touch sensitive technologies.

Device processor 650 may write data to storage module 610, for example data representing captured images and data generated during phase detection and/or pixel value calculation. While storage module 610 is represented schematically as a traditional disk device, storage module 610 may be configured as any storage media device. For example, the storage module 610 may include a disk drive, such as an optical disk drive or magneto-optical disk drive, or a solid state memory such as a FLASH memory, RAM, ROM, and/or EEPROM. The storage module 610 can also include multiple memory units, and any one of the memory units may be configured to be within the image capture device 600, or may be external to the image capture device 600. For example, the storage module 610 may include a ROM memory containing system program instructions stored within the image capture device 600. The storage module 610 may also include memory cards or high speed memories configured to store captured images which may be removable from the camera. The storage module 610 can also be external to image capture device 600, and in one example image capture device 600 may wirelessly transmit data to the storage module 610, for example over a network connection. In such embodiments, storage module 610 may be a server or other remote computing device.

Although FIG. 6 depicts an image capture device 600 having separate components to include a processor, imaging sensor, and memory, one skilled in the art would recognize that these separate components may be combined in a variety of ways to achieve particular design objectives. For example, in an alternative embodiment, the memory components may be combined with processor components, for example to save cost and/or to improve performance.

Additionally, although FIG. 6 illustrates two memory components, including memory 630 comprising several modules and a separate memory component comprising a working memory 605, one with skill in the art would recognize several embodiments utilizing different memory architectures. For example, a design may utilize ROM or static RAM memory for the storage of processor instructions implementing the modules contained in memory 630. The processor instructions may be loaded into RAM to facilitate execution by the image signal processor 620. For example, working memory 605 may comprise RAM memory, with instructions loaded into working memory 605 before execution by the image signal processor 620.

Implementing Systems and Terminology

Implementations disclosed herein provide systems, methods and apparatus for mask-less phase detection autofocus. One skilled in the art will recognize that these embodiments may be implemented in hardware, software, firmware, or any combination thereof.

In some embodiments, the circuits, processes, and systems discussed above may be utilized in a wireless communication device. The wireless communication device may be a kind of electronic device used to wirelessly communicate with other electronic devices. Examples of wireless communication devices include cellular telephones, smart phones, Personal Digital Assistants (PDAs), e-readers, gaming systems, music players, netbooks, wireless modems, laptop computers, tablet devices, etc.

The wireless communication device may include one or more image sensors, one or more image signal processors, and a memory including instructions or modules for carrying out the process discussed above. The device may also have data, a processor loading instructions and/or data from memory, one or more communication interfaces, one or more input devices, one or more output devices such as a display device and a power source/interface. The wireless communication device may additionally include a transmitter and a receiver. The transmitter and receiver may be jointly referred to as a transceiver. The transceiver may be coupled to one or more antennas for transmitting and/or receiving wireless signals.

The wireless communication device may wirelessly connect to another electronic device (e.g., base station). A wireless communication device may alternatively be referred to as a mobile device, a mobile station, a subscriber station, a user equipment (UE), a remote station, an access terminal, a mobile terminal, a terminal, a user terminal, a subscriber unit, etc. Examples of wireless communication devices include laptop or desktop computers, cellular phones, smart phones, wireless modems, e-readers, tablet devices, gaming systems, etc. Wireless communication devices may operate in accordance with one or more industry standards such as the 3rd Generation Partnership Project (3GPP). Thus, the general term "wireless communication device" may include wireless communication devices described with varying nomenclatures according to industry standards (e.g., access terminal, user equipment (UE), remote terminal, etc.).

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It should be noted that the terms "couple," "coupling," "coupled" or other variations of the word couple as used herein may indicate either an indirect connection or a direct connection. For example, if a first component is "coupled" to a second component, the first component may be either indirectly connected to the second component or directly connected to the second component. As used herein, the term "plurality" denotes two or more. For example, a plurality of components indicates two or more components.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

In the foregoing description, specific details are given to provide a thorough understanding of the examples. However, it will be understood by one of ordinary skill in the art that the examples may be practiced without these specific details. For example, electrical components/devices may be shown in block diagrams in order not to obscure the examples in unnecessary detail. In other instances, such components, other structures and techniques may be shown in detail to further explain the examples. Thus, the present invention is not intended to be limited to the implementations shown herein but is to be accorded the widest scope consistent with the principles and novel features disclosed herein.

What is claimed is:

1. An image capture device comprising:
an image sensor comprising
a plurality of diodes configured to generate values that represent an image of a target scene;
a color filter array disposed above the plurality of diodes, the color filter array comprising a plurality of color filters each positioned over one of the plurality of diodes;
a plurality of single-diode microlenses each positioned above one of the plurality of color filters, the plurality of color filters, corresponding to the plurality of single-diode microlenses, arranged in a Bayer pattern;
a plurality of multi-diode microlenses for phase difference detection, each multi-diode microlens of the plurality of multi-diode microlenses positioned above at least two adjacent color filters of the plurality of color filters, each of the at least two adjacent color filters configured to pass the same wavelengths of light, and formed such that light incident in a first direction is collected in a first diode of at least two adjacent diodes and light incident in a second direction is collected in a second diode of the at least two adjacent diodes, wherein a first color filter of the at least two adjacent color filters positioned below a multi-diode microlens conforms to the Bayer pattern, a second color filter of the at least two adjacent color filters positioned below the multi-diode microlens deviates from the Bayer pattern; and
an image signal processor configured to
form the image of the target scene in part by, for each multi-diode microlens, summing values of diodes positioned below the multi-diode microlenses to determine a value of the first diode positioned below the first color filter, and by interpolating values of diodes positioned in a neighborhood of the second diode positioned below the second color filter to determine the value of the second diode positioned below the second color filter; and
perform phase detection autofocus using values received from the at least two adjacent diodes.

2. The image capture device of claim 1, wherein, for each of the plurality of multi-diode microlenses, wavelengths of light that the at least two adjacent color filters are configured to pass correspond to green light.

3. The image capture device of claim 1, wherein each of the plurality of multi-diode microlenses is positioned over two adjacent color filters and associated diodes.

4. The image capture device of claim 1, wherein each of the plurality of multi-diode microlenses is positioned over a 2×2 cluster of color filters and associated diodes.

5. The image capture device of claim 1, wherein, to perform phase detection autofocus, the image signal processor is further configured to:
receive, from the first diode, first image data representing light incident on the image sensor in the first direction;
receive, from the second diode, second image data representing light incident on the image sensor in the second direction;
calculate disparity between the first image data and the second image data; and
use the disparity to generate focus instructions.

6. The image capture device of claim 5, further comprising a movable lens assembly positioned above the image sensor.

7. The image capture device of claim 6, wherein the focus instructions comprise a distance and direction for moving the movable lens assembly to a desired focus position.

8. The image capture device of claim 7, wherein the image signal processor is further configured to generate instructions that cause the image sensor to capture image data with the movable lens assembly positioned in the desired focus position and, based at least partly on the image data, construct a final image of the target scene.

9. The image capture device of claim 5, further comprising a lens assembly positioned above the image sensor, wherein the image sensor is movable relative to the lens assembly.

10. The image capture device of claim 9, wherein the focus instructions comprise a distance and direction for moving the image sensor to a desired focus position.

11. The image capture device of claim 1, wherein the plurality of single-diode microlenses and the plurality of multi-diode microlenses arranged in a repeating pattern having the plurality of multi-diode microlenses each located one of a plurality of autofocus points in the repeating pattern.

12. An image signal processor configured with instructions for performing a process for constructing a final image, the process comprising:
receiving image data from a plurality of diodes of an image sensor, the image data comprising:
a plurality of imaging pixel values from a first subset of the plurality of diodes associated with a plurality of color filters arranged in a Bayer pattern that receives light propagating through single-diode microlenses, and
a plurality of phase detection pixel values from a second subset of the plurality of diodes associated with a plurality of color filters deviating from the Bayer pattern such that each of the plurality of phase detection pixel values comprises a green pixel value, the second subset of the plurality of diodes receiving light propagating through multi-diode microlenses and arranged in a plurality of groups of adjacent diodes, each group of adjacent diodes receiving light from a corresponding multi-diode microlens formed such that light incident in a first direction is collected in a first diode of the group and light incident in a second direction is collected in a second diode of the group, wherein the phase detection pixel value from the first diode of each group of adjacent diodes is generated by light passing through a green color filter conforming to the Bayer pattern, the phase detection pixel value from the second diode of each group of adjacent diodes is generated by light passing through a green color filter deviating from the Bayer pattern;
calculating, for each of the plurality of groups of adjacent diodes, a single green pixel value corresponding to a location of the first diode of the group;
calculating, for each of the plurality of groups of adjacent diodes, a missing blue or red pixel value corresponding to a location of the second diode of the group, wherein calculating the single green pixel value comprises using a summed value of diodes positioned below the multi-diode microlenses to determine a value of the first diode of the group; and constructing the final image based at least partly on the plurality of imaging pixel values, the calculated missing blue or red pixel values, and the calculated single green pixel values.

13. The image signal processor of claim 12, wherein a phase detection pixel value of the plurality of phase detection pixel values received from one diode of the plurality of diodes has a brightness value similar to brightness values of imaging pixel values received from other diodes of the plurality of diodes adjacent to the one diode.

14. The image signal processor of claim 12, wherein constructing the final image is done at least partly via demosaicking.

15. The image signal processor of claim 12, wherein calculating the missing blue or red pixel value for each of the plurality of groups of adjacent diodes comprises identifying, based on the Bayer pattern, whether the second diode corresponds to a blue pixel location or a red pixel location.

16. The image signal processor of claim 15, wherein, when the second diode corresponds to the blue pixel, calculating the missing blue or red pixel value comprises:

identifying, from the plurality of imaging pixel values, a plurality of blue pixel values within a predetermined neighborhood of the blue pixel location of the second diode; and interpolating a blue pixel value for the second diode based at least partly on the plurality of blue pixel values.

17. The image signal processor of claim 16, wherein the predetermined neighborhood comprises values received from diodes within a 5×5 cluster having the second diode at its center.

18. The image signal processor of claim 15, wherein, when the second diode corresponds to the red pixel, calculating the missing blue or red pixel value comprises:

identifying, from the plurality of imaging pixel values, a plurality of red pixel values within a predetermined neighborhood of the red pixel location of the second diode; and interpolating a red pixel value for the second diode based at least partly on the plurality of red pixel values.

19. An image capture apparatus comprising:
image capture means comprising
a plurality of sensing means configured to generate values that represent an image of a target scene;
a plurality of color filter means disposed above the plurality of sensing means, each of the plurality of color filter means positioned over one of the plurality of sensing means;
a plurality of first light focusing means each positioned above one of the plurality of color filter means, a first subset of the plurality of color filter means corresponding to the plurality of first light focusing means arranged in a Bayer pattern;
a plurality of second light focusing means for generating phase difference detection information, each of the plurality of second light focusing means
positioned above at least two adjacent color filter means of the plurality of color filter means, each of the at least two adjacent color filter means configured to pass the same wavelengths of light, wherein a first color filter means of the at least two adjacent color filter means positioned below a second light focusing means conforms to the Bayer pattern, a second color filter means of the at least two adjacent color filter means positioned below the second light focusing means deviates from the Bayer pattern, and
formed such that light incident in a first direction is collected in a first sensing means of at least two adjacent sensing means and light incident in a second direction is collected in a second sensing means of the at least two adjacent sensing means; and
image processing means configured to
form the image of the target scene in part by, for each of the plurality of second light focusing means, summing values of sensing means positioned below the second light focusing means to determine a value of the first sensing means positioned below the first color filter means, and by interpolating values of sensing means positioned in a neighborhood of the second sensing means positioned below the second color filter means to determine the value of the second sensing means positioned below the second color filter means, and
perform phase detection autofocus using values received from the at least two adjacent sensing means corresponding to one of the plurality of second light focusing means.

20. The image capture apparatus of claim 19, wherein the image capture means further comprises a primary focusing means positionable based at least partly on data received from the image signal processing means to produce an in-focus image of the target scene.

21. The image capture apparatus of claim 20, wherein the primary focusing means comprises a movable lens assembly positioned above the plurality of color filter means.

22. The image capture apparatus of claim 20, wherein the primary focusing means comprises a mechanism for moving the plurality of sensing means.

\* \* \* \* \*